(12) United States Patent
Syo

(10) Patent No.: US 6,313,648 B1
(45) Date of Patent: Nov. 6, 2001

(54) METHOD FOR QUANTITATING IMPURITY CONCENTRATION IN A SEMICONDUCTOR DEVICE

(75) Inventor: Toshiyuki Syo, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/629,832

(22) Filed: Jul. 31, 2000

Related U.S. Application Data

(62) Division of application No. 09/192,475, filed on Nov. 17, 1998, now Pat. No. 6,130,542.

(30) Foreign Application Priority Data

Nov. 17, 1997 (JP) .................................................. 9-332385

(51) Int. Cl.[7] .................................................. G01R 31/26
(52) U.S. Cl. .............................. 324/719; 324/766; 438/17
(58) Field of Search .................................. 324/719, 766, 324/663, 752, 619, 767, 158; 438/14, 17

(56) References Cited

U.S. PATENT DOCUMENTS

| | | | |
|---|---|---|---|
| 5,196,802 | 3/1993 | Burgener et al. | 324/663 |
| 5,298,860 | 3/1994 | Kato | 324/158 |
| 5,869,363 | 2/1999 | Yamazaki et al. | 438/166 |
| 5,883,518 | 3/1999 | Borden | 324/752 |
| 5,943,552 | 8/1999 | Koveshnikov et al. | 438/17 |

OTHER PUBLICATIONS

"Solid Surface Analysis I", pp. 196–257, published by Kodansha Ltd., Apr. 20, 1995.

Nicollian, et al., "MOS(Metal Oxide Semiconductor)", Physics and Technology, pp. 371–422, John Wiley and Sons, Inc., 1982.

*Primary Examiner*—Safet Metjahic
*Assistant Examiner*—Anjan K Deb
(74) *Attorney, Agent, or Firm*—McGinn & Gibb, PLLC

(57) ABSTRACT

Measurement of pulse CV characteristics and an SIMS measurement of a semiconductor substrate are made at the same position. An SIMS profile is calibrated by a method of least squares so that a dose amount determined from the SIMS profile coincide with a dose amount determined from the concentration profile of a carrier which is calculated from the pulse CV characteristics in a range where accuracy of the carrier concentration is secured. In the case where plural impurities are introduced, a measurement of pulse CV and SIMS measurement are made and the distribution of impurity concentration and the distribution of carrier concentration are estimated by simulation every time when an impurity is introduced. When an impurity is introduced in a high concentration, an impurity of the inverse conductive-type to that of the former impurity is introduced.

8 Claims, 8 Drawing Sheets

METHOD FOR QUANTITATING IMPURITY CONCENTRATION IN A SEMICONDUCTOR DEVICE

This application is a Div. of Ser. No. 09/192,475 filed Nov. 17, 1998, now U.S. Pat. No. 6,130,542.

BACKGROUND OF THE INVENTION

1. Field of the Invention

The present invention relates to a method for quantitating impurity concentration and recording medium storing record of program for quantitating impurity concentration in semiconductor devices and the like, and, particularly, to a method for quantitating impurity concentration and recording medium storing record of program for quantitating impurity concentration by which highly accurate measurement can be made.

2. Description of the Related Art

There have been 70 or more methods proposed for measuring an impurity distribution in the direction of the depth in the vicinity of the surface of semiconductor devices and the like. Among these methods, SIMS (secondary ion mass spectrometry) is widely used since the information of the type and amount of trace elements in the direction of the depth can be obtained with marked sensitivity. The details of SIMS are described, for example, in the literature "SOLID SURFACE ANALYSIS I, PP. 196–257, published by KODANSHA, 1995". Incidentally, SIMS is an analytical method in which a sample is destroyed.

In the analysis of impurity distribution using SIMS, a primary ion is applied to a sample to quantitatively analyze a secondary ion emitted from the sample. Because of this, even in the cases where impurities in the sample are inert and the impurity concentration is high, an analysis of the inside apart from the interface of the sample such as semiconductor substrates can be made with high sensitivity. SIMS has a large advantage which is unrivaled by other measuring methods.

A typical nondestructive analysis method currently used includes, those, such as RBS (Rutherford backscattering method) making use of energy scatter or methods based on a pulse CV measurement making use of, as its measurement principle, variation of a depletion layer which phenomenon is peculiar to semiconductors. A method for measuring the distribution of carrier concentration by means of pulse CV measurement is often adopted as the nondestructive analysis method particularly in semiconductor fields because of its simplicity.

For example, a distribution of carrier concentration supported by the pulse CV characteristics can be measured in a method for calculating the distribution of carrier concentration based on a pulse CV measurement as described in the literature "E. H. NICOLLIAN and J. R. BREWS, MOS Physics and Technology, pp. 371–422, JOHN WILEY & SONS, Inc., 1982".

The pulse CV measurement can be easily made plural times because it is a nondestructive measurement. Hence even if there is a measurement fluctuation in a measurement device, the measurement fluctuation can be eliminated by means of a statistical method.

However, the process in which a secondary ion is produced in the quantitative measurement of impurity concentration by using SIMS is not clarified because it is complicated and diversified. Therefore, only empirical techniques have been put to practical use. Specifically, techniques using a standard sample are mostly adopted in general. However, in these methods, tens and several of percents of errors are produced according to the qualities of the standard sample, calculating methods of RSF (relative sensitivity factor), daily error variations and the like. Moreover, SIMS is a destructive analysis method and hence it is impossible that the influence of a fluctuation of RSF is eliminated by a statistical method based on repeated plural measurements and hence the impurity concentration cannot be calibrated.

On the other hand, in the method for calculating the distribution of carrier concentration based on the pulse CV measurement, the distribution of carrier concentration is calculated from a variation in the width of a depletion region when voltage is applied to a sample. Therefore, when a plurality of impurities is present, only a total amount of a carrier effected by all of these impurities can be measured.

When an impurity is introduced in a high concentration, the range of the distribution of carrier concentration obtained based on the pulse CV measurement is made narrow, which makes it impossible to obtain the total profile of the impurity introduced. In addition, in the case where an impurity is inert, no coincidence between impurity concentration and carrier concentration can be brought about because the inert impurity does not contribute to the electric properties. Therefore, there is a demand for a quantitative method enabling simple, widespread and highly accurate measurement of impurities.

As aforementioned, in the measurements using SIMS, accurate impurity concentration can not be quantitatively measured when there is no standard sample. This is because of the following reasons. Specifically, the value obtained directly from SIMS is an ion number per unit time. However, since a process in which this ion is produced is not clarified, it is mostly necessary to use an empirical method such as a method utilizing a calibration curve and using a standard sample. Even in the case where the standard sample is used, the daily errors of the relative sensitivity function RSF are large and hence measurement fluctuations are present. Moreover, since SIMS is a destructive analysis method, fluctuations in the results of the measurement cannot be eliminated by a statistical method, which makes it difficult to measure impurities quantitatively.

Accordingly, to measure impurity concentration using SIMS, a standard sample designed to have definite distribution of impurity concentration is required. However, a standard sample usable for an essential element cannot always be obtained. Even in the case where the standard sample is present, measurement fluctuations causes a variation in the measured impurity concentration. Also, since SIMS is a destructive analysis method, elimination of fluctuations by a statistical method is difficult, giving rise to the problem that accurate impurity concentration is not necessarily measured.

In the method for calculating the distribution of carrier concentration from the profile obtained by pulse CV measurement, accurate impurity concentration in a widespread region cannot be measured when plural impurities are present in the measuring area, the impurities are inert or impurities are present in a high concentration.

This is because of the following reason. Specifically, when the distribution of carrier concentration is calculated from a pulse CV measurement, a variation in the width of a depletion region when voltage is applied is utilized. In order for the distribution of an impurity to coincide with the distribution of carrier concentration, it is necessary that an impurity which is to be a carrier is the same as a comparative impurity and this comparative impurity is only one material corresponding to this case. Also, all impurities present in the system must be active. An introduction of an impurity in a high concentration limits the range in which the accuracy of the measurement of the distribution of carrier concentration is secured. For example, the range of measurement of the distribution of carrier concentration obtained based on pulse CV measurement is limited to narrow regions. As a consequence, the distribution of carrier concentration at a desired depth cannot be obtained.

Therefore, if plural impurities have been introduced when it is intended to measure the distribution of carrier concentration by pulse CV measurement, it is difficult to measure each concentration of impurities separately. When an impurity is introduced in a high concentration, the distribution of carrier concentration only in the vicinity of the interface can be measured. Moreover in the case where the impurity is inert, the distribution of carrier concentration does not coincide with the distribution of the impurity concentration.

SUMMARY OF THE INVENTION

An object of the present invention is to provide a method for quantitating impurity concentration and a recording medium in which a program for quantitating impurity concentration is recorded, the method being characterized in that it is provided with the advantages of SIMS and pulse CV measurement and that an impurity distribution supported by electric characteristics can be obtained at wide-ranging depths. SIMS has the advantages that, for example, measurable depths are wide-ranged, it can respond to the case of introducing a plurality of impurities and it can measure the concentrations of inert impurities. The pulse CV measurement has the advantage such as the absolute value of carrier concentration can be obtained and the like.

The method for quantitating impurity concentration according to the present invention has a step of measuring pulse CV characteristics of a semiconductor substrate. Next, distribution of carrier concentration in the direction of the depth of the semiconductor substrate is calculated from the pulse CV characteristics. Then, SIMS measurement of the semiconductor device is made at the same position as in the case of measuring the pulse CV characteristics to calculate SIMS profile of an impurity. The SIMS profile is calibrated by a method of least squares so that a dose amount got from the SIMS profile coincide with a dose amount got from the distribution of carrier concentration in a range of depth where accuracy of the carrier concentration is secured.

In the present invention, the SIMS profile is calibrated by making use of the distribution of carrier concentration got from the measured value of pulse CV characteristics. This enables it possible to quantitate impurity concentration accurately at wide-ranging depths.

In addition, every time when an impurity is introduced, a course of operations including an SIMS measurement, measurement of pulse CV characteristics, simulation using the result measured last time, estimation of the distributions of impurity concentration and carrier concentration, comparison of the estimated values with actual values, and calculation of a dose amount of the impurity may be carried out. In this case, even if plural impurities are introduced, impurity concentration can be measured quantitatively and accurately.

Moreover, after a first impurity of a first conductive-type is introduced, a second impurity of a second conductive-type that is the inverse of the first conductive-type may be introduced. In this case, even if the first impurity is introduced in a high concentration, a wide-ranging profile can be obtained by the measurement of pulse CV characteristics.

DETAILED DESCRIPTION OF THE PREFERRED EMBODIMENTS

Figure 1:
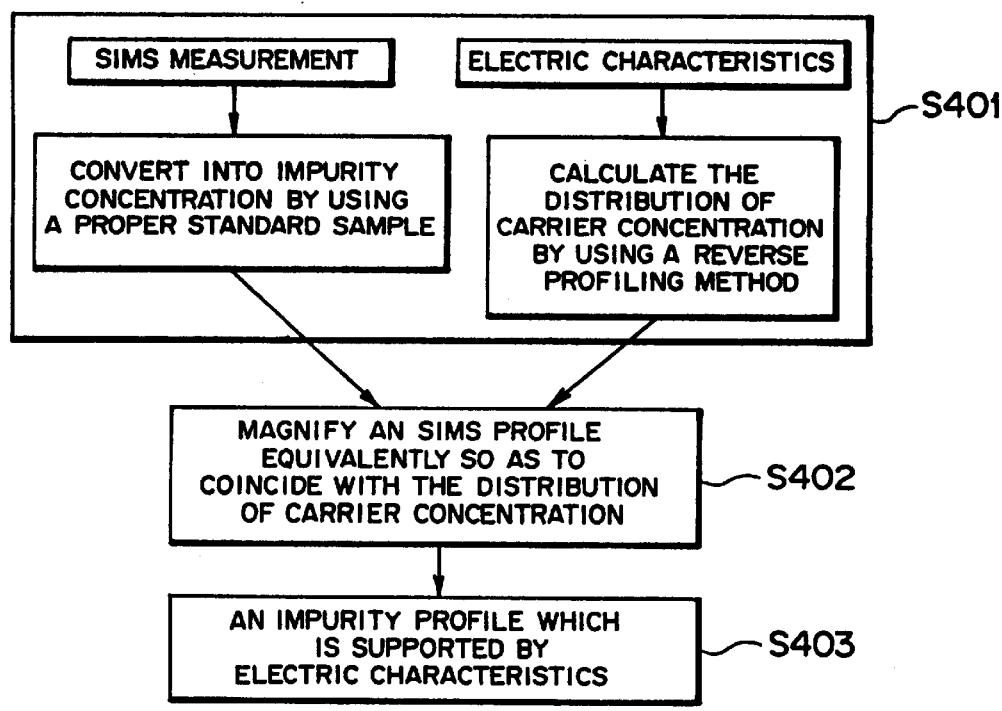
FIG. 1 is a flow chart showing major steps in each embodiment of the present invention.

A method for quantitating impurity concentration according to an embodiment of the present invention will be described in detail with reference to the drawings attached. FIG. 1 is a flow chart showing major steps in each embodiment of the present invention. In each embodiment of the present invention, pulse CV measurement and SIMS measurement are made at the same position of the same sample (step S401).

Figure 2:
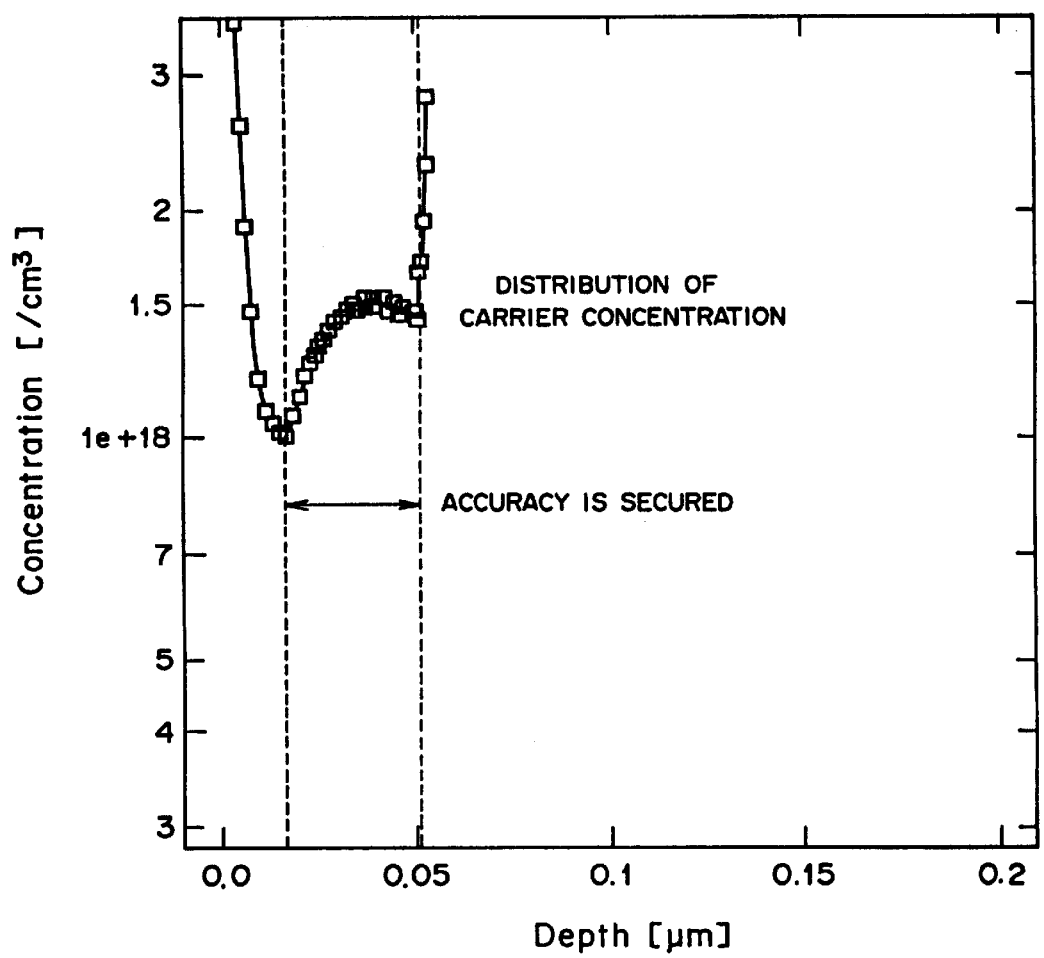
FIG. 2 is a graph showing the relation between the depth of a sample and carrier concentration.

At this time, in the pulse CV measurement, a profile of carrier concentration is calculated using, for example, a reverse profiling method. FIG. 2 is a graph showing the relation between the depth of a sample and carrier concentration wherein the ordinate indicates the depth of a sample and the abscissa indicates carrier concentration. In the pulse CV measurement, a graph as shown in FIG. 2 is obtained. However, the range in which its accuracy is secured is only that between the inflection points in FIG. 2.

Figure 3:
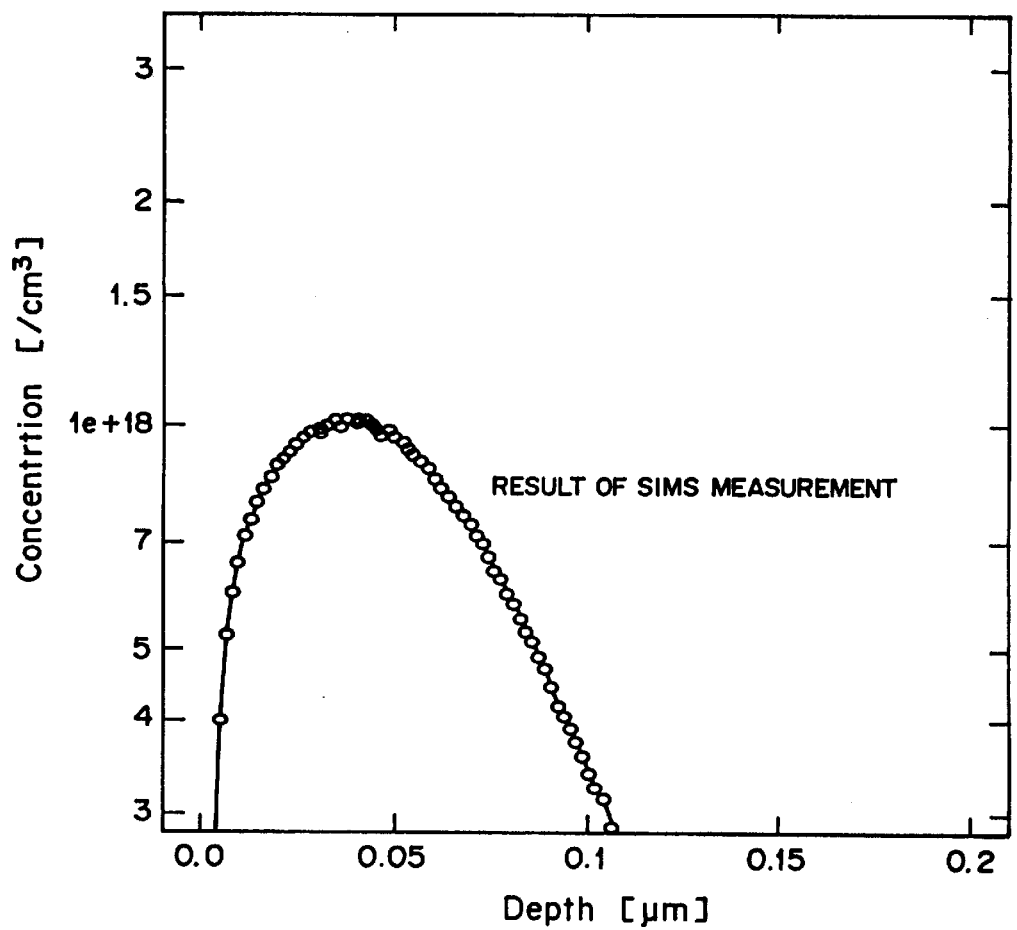
FIG. 3 is a graph showing the relation between the depth of a sample and impurity concentration.

In the SIMS measurement, a measurement is made at the same position of the same sample as in the case of making the pulse CV measurement to calculate the profile of impurity concentration. FIG. 3 is a graph showing the relation between the depth of a sample and carrier concentration wherein the ordinate indicates the depth of a sample and the abscissa indicates carrier concentration. In the SIMS measurement, a graph as shown in FIG. 3 is obtained.

Figure 4:
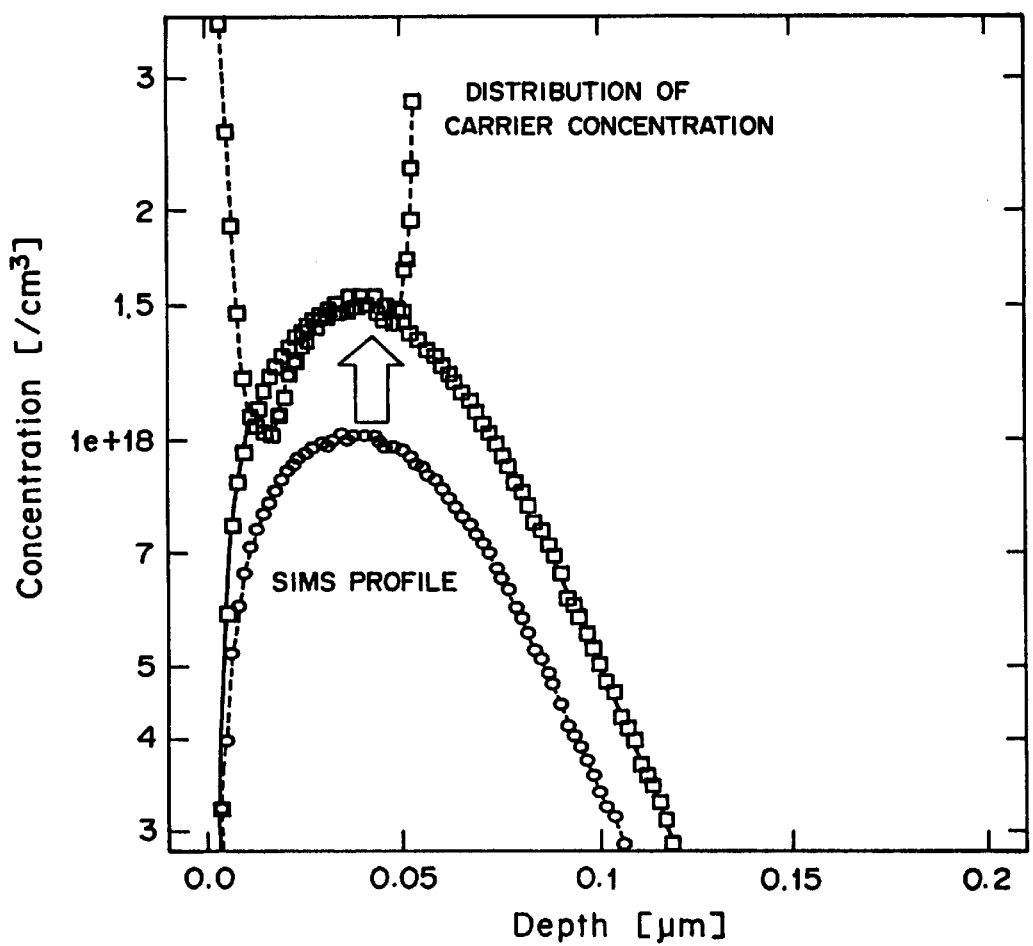
FIG. 4 is a graph showing an SIMS profile which is equivalently magnified.

Next, the relative sensitivity function RSF is altered by a method of least squares so that, in the range of depth where accuracy of the carrier concentration is secured, a dose amount got from carrier concentration calculated in the step S401 coincide with a dose amount got from impurity concentration which is also calculated in the step S401 and SIMS profiles at each depth are equivalently magnified (step S402). FIG. 4 is a graph showing an SIMS profile which is equivalently magnified wherein the ordinate indicates the depth of a sample and the abscissa indicates carrier concentration. The equivalent magnification of the SIMS profile results in the fact that the distribution of impurity concentration supported by the electric characteristics based on the pulse CV measurement can be obtained as shown in FIG. 4.

Figure 5:
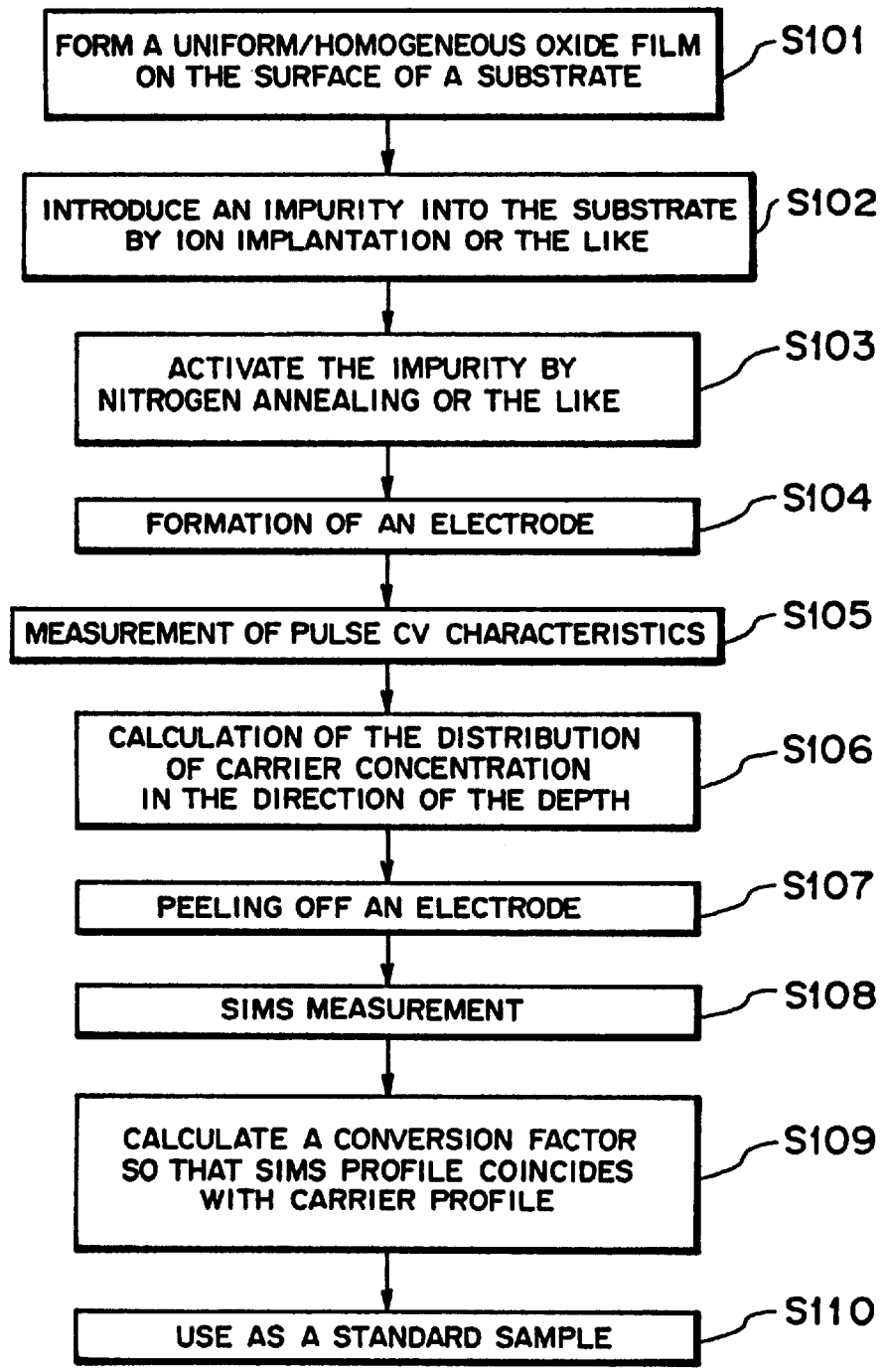
FIG. 5 is a flow chart showing a method for quantitating impurity concentration according to a first embodiment of the present invention.

Next, a first embodiment of the present invention will be explained. FIG. 5 is a flow chart showing a method for quantitating impurity concentration corresponding to a first embodiment of the present invention.

In the first embodiment, first a uniform and homogeneous oxide film is formed on the surface of a substrate (step S101). Then, the thickness of the oxide film is measured.

Next, an impurity is introduced into the substrate by means of, for example, ion implantation or solid phase diffusion (step S102). At this time, the impurity introduced by means of ion implantation or the like is inert.

Then all of the impurities introduced are activated by annealing treatment in a nitrogen atmosphere or the like (step S103).

After that, an conductive layer, such as an aluminum layer, which will be an electrode for making a pulse CV measurement is deposited on the oxide film (step S104).

In succession, the pulse CV characteristics are measured using the conductive layer as the electrode (step S105).

From the pulse CV characteristics obtained by the pulse CV measurement, the extension of a depletion region is calculated to thereby calculate the distribution of carrier concentration in the direction of the depth (step S106).

In the next step, the conductive layer, for example, an aluminum layer, used for the electrode is peeled off (step S107).

Consecutively, an SIMS measurement is made at the same position as in the case of making the pulse CV measurement (step S108). The steps S105 to S108 correspond to the step S401 shown in FIG. 1.

Then, a conversion factor is calculated by a method of least squares so that, in the range of depth where accuracy of the carrier concentration is secured, a dose amount got from the profile of impurity concentration calculated in the step S108 coincide with a dose amount go from the profile of carrier concentration calculated in the step S106 to calibrate the impurity concentration based on the SIMS measurement (step S109). The step S109 corresponds the steps S402 and S403 shown in FIG. 1.

Next, this sample of which calibrated impurity concentration is obtained in the steps S101 to S109 is used as a standard sample to make the SIMS measurement of impurity concentrations of other samples (step S110).

In the case where, as a mercury prover do, a pulse CV-measuring device itself is provided with a built-in electrode, the steps S104 and S107 may be omitted.

In this embodiment, an impurity is introduced (step S102) as aforementioned. However, in a sample into which one active impurity has been introduced, the impurity concentration can be measured if the sample is only treated in the series of steps in succession to the step S105. Hence this embodiment can be applied to the case of calibrating commercially available standard samples.

Figure 6A:
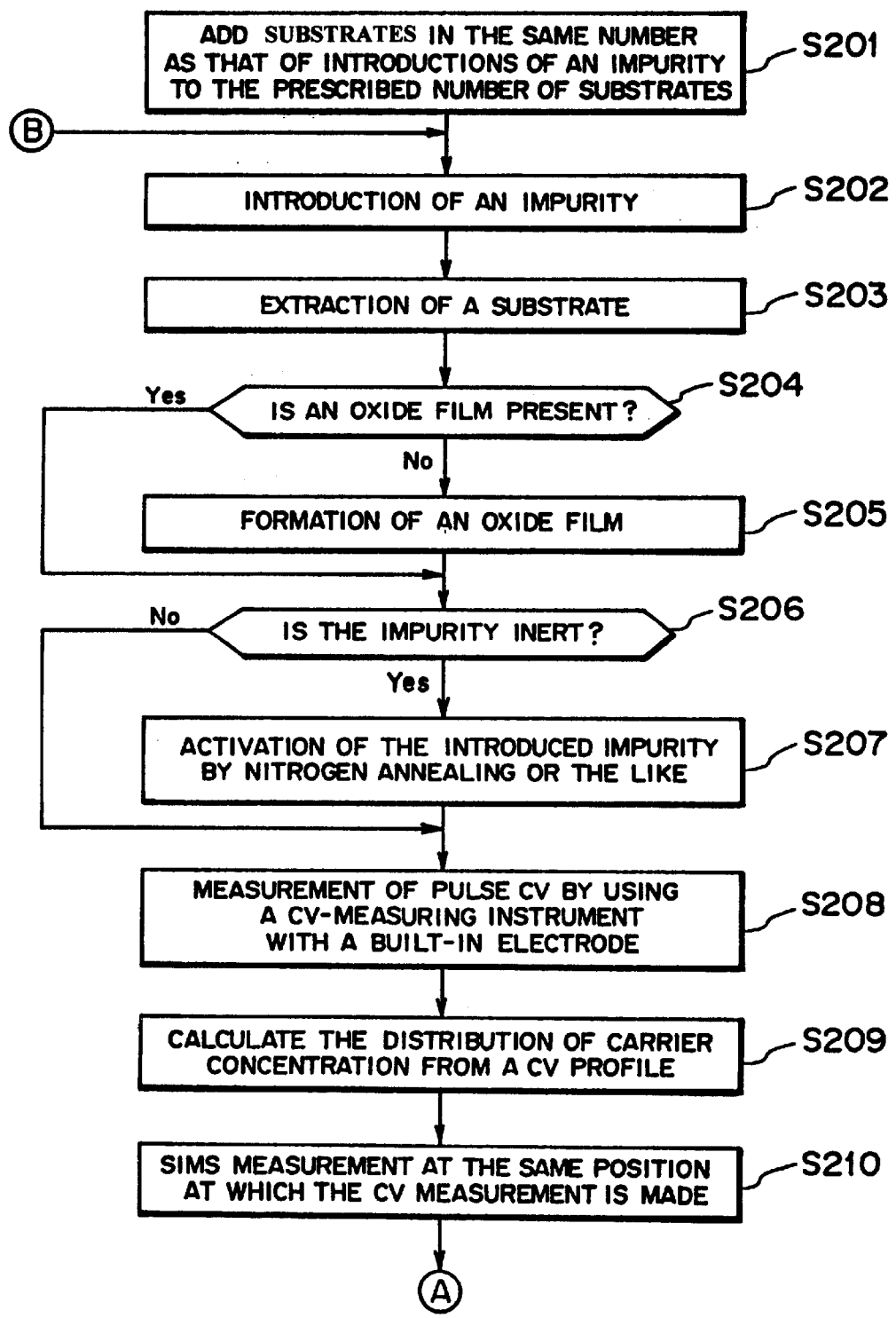
FIGS. 6A and 6B are flow charts showing a method for quantitating impurity concentration corresponding to a second embodiment of the present invention.
Figure 6B:
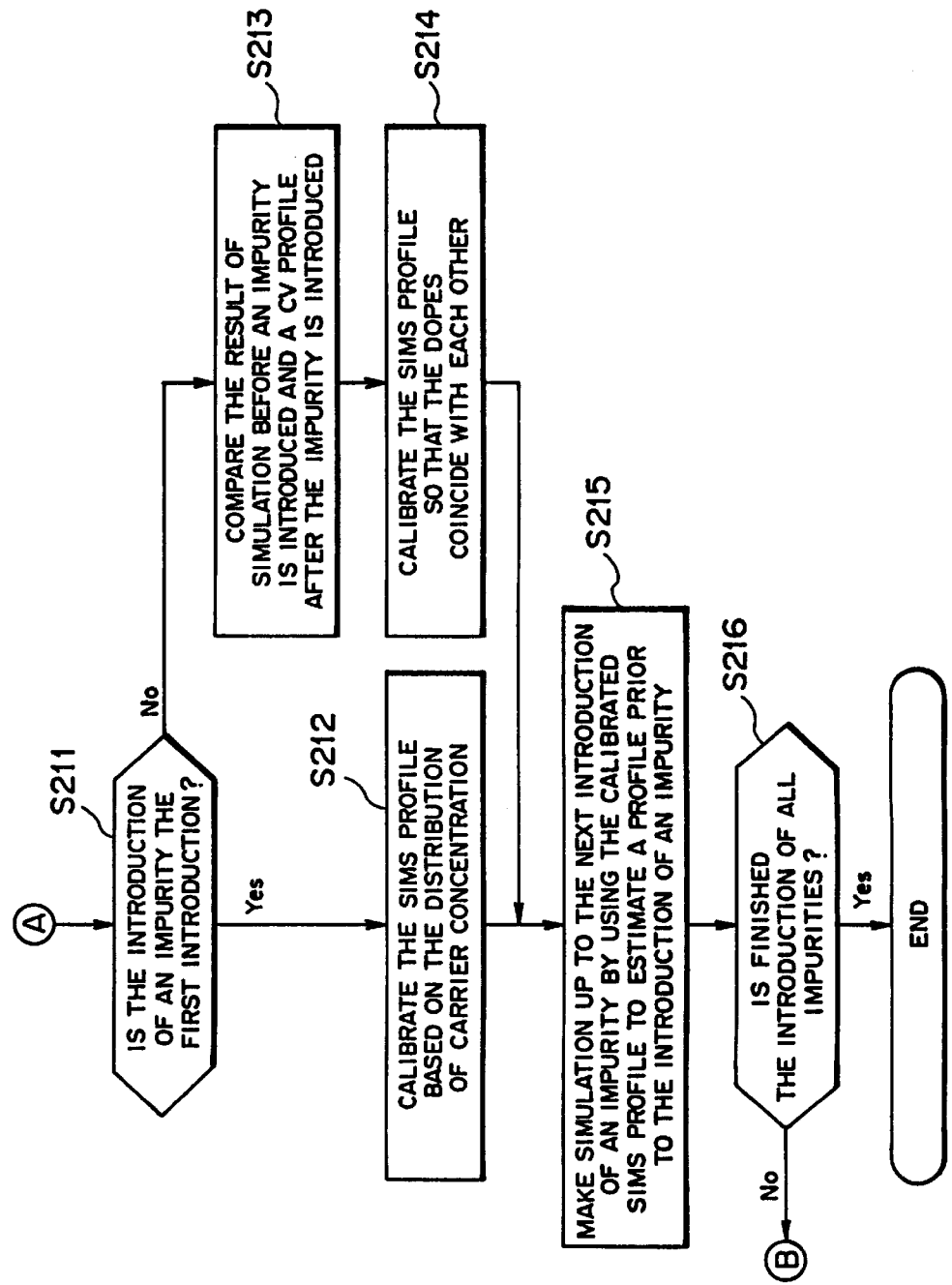

Next, a second embodiment of the present invention will be explained. This embodiment is preferred in the case of introducing plural kinds of impurities. In general, when plural kinds of impurities are introduced, it is difficult to analyze the distribution of carrier concentration by usual pulse CV measurement. In the first embodiment, a method for quantitating impurity concentration of an ideal sample is explained. However, because the result of the pulse CV measurement of the standard sample is allowed to reflect on the measurement of impurity concentration of other samples, generally, it is necessary to compensate the defects of the pulse CV measurement. FIGS. 6A and 6B are flow charts showing a method for quantitating impurity concentration corresponding to the second embodiment of the present invention.

In this embodiment, first when a usual device is produced, additional substrates are prepared in the same number as that of impurities introduced in the step of producing a device required to obtain the distribution of impurities (step S201). It is noted that no pattern is formed on these additional substrates and these substrates will be extracted in the later step.

Next, an impurity is introduced into each substrate (step S202).

Then, one of the additional substrates is extracted (step S203).

In the succeeding step, a judgment is made on whether an oxide film is formed or not on the surface of the extracted substrate (step S204).

When an oxide film is not formed, an oxide film is formed at the surface of the extracted substrate (step S205) and then a judgment is made on whether the impurity in the extracted substrate is inert or not (step S206). On the other hand, when an oxide film is formed, a judgment is made on whether the impurity in the substrate is inert or not without forming an oxide film (step S206).

In the case where the impurity in the extracted substrate is inert, all impurities in the substrate are activated by annealing treatment in a nitrogen atmosphere or the like treatment (step S207) and then the pulse CV characteristics are measured using a pulse CV-measuring device provided with a built-in electrode, such as a mercury prover (step S208). On the other hand, when the impurity in the substrate is activated, the pulse CV characteristics are measured without activating the impurity (step S208).

Next, an extension of a depletion layer is calculated from the pulse CV characteristics of the extracted substrate to calculate the distribution of carrier concentration in the direction of the depth (step S209).

In succession, the SIMS measurement is made at the same position as in the case of making the pulse CV measurement (step S210). The steps S208 to S210 correspond to the step S401 shown in FIG. 1.

Then, the number of introductions of an impurity is confirmed (step S211).

When the introduction of an impurity is the first introduction, the impurity concentration based on the SIMS measurement is calibrated by a method of least squares so that, in the range of depth where accuracy of the carrier concentration is secured, a dose amount got from the profile of impurity concentration obtained in the step S210 coincide with a dose amount got from the profile of the carrier concentration obtained in the step S209 in the same manner as in the first embodiment (step S212). The step S212 corresponds to the step S402 shown in FIG. 1. The calibrated profile is defined as the initial data and steps prior to the next introduction of an impurity are simulated to estimate a profile of impurity concentration and a profile of carrier concentration prior to the next introduction of an impurity (step S215).

On the other hand, if the introduction of an impurity is not the first introduction, the profile of carrier concentration prior to an introduction of an impurity which profile is estimated by the simulation of the step S215 when the last introduction of an impurity was made is compared with the profile of carrier concentration calculated in the step S209 after the instant introduction of an impurity is made to calculate a dose amount (step S213). In the next step, the impurity concentration of the instant SIMS profile is calibrated by a method of least squares so that the difference between the instant SIMS profile calculated in the step S210 and the last SIMS profile coincide with a dose amount calculated in the step S213 (step S214). Then, in the same manner as in the case of the first introduction, profiles of impurity concentration and carrier concentration prior to the next introduction of an impurity are estimated (step S215).

After the above step, whether the introductions of all impurities have been made or not is judged (step S216).

When the introductions of all impurities have been completed, the extraction of a substrate and the analysis of the distribution of an impurity are finished. On the other hand, when the introductions of all impurities have not been completed, the next impurity is introduced into each substrate (step S202). Then the steps S202 to S216 are repeated until the introductions of all impurities are completed.

These steps ensure that an impurity profile supported by the electric characteristics can be obtained as shown in the step S403 in FIG. 1.

Figure 7:
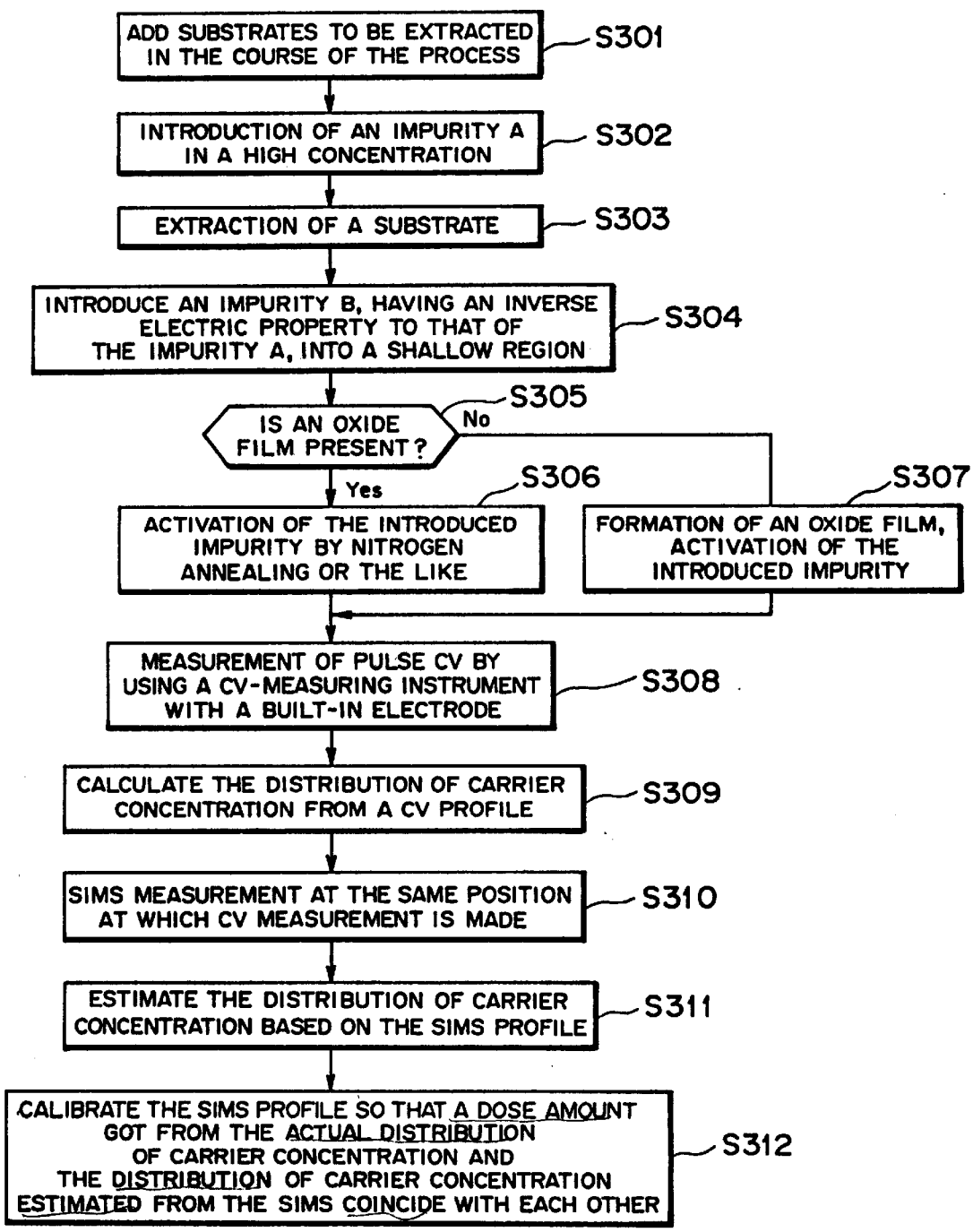
FIG. 7 is a flow chart showing a method for quantitating impurity concentration according to a third embodiment of the present invention.

Next, a third embodiment of the present invention will be explained. This embodiment is a preferred embodiment in the case where an impurity is introduced in a high concentration. In this embodiment, all impurities to be introduced will be activated. In general, when an impurity is introduced in a high concentration, the SIMS profile can be calibrated with difficulty based on the distribution of carrier concentration calculated from the results of the pulse CV measurement. FIG. 7 is a flow chart showing a method for quantitating impurity concentration according to the third embodiment of the present invention.

In this embodiment, additional substrates which will be extracted in the later step and to which no pattern is formed are added when a usual device is produced (step S301).

Next, a first impurity A of a first conductive-type is introduced in a high concentration into each substrate (step S302).

Then, one of the additional substrates is extracted (step S303).

A second impurity B of a second conductive-type is introduced into the extracted substrate (step S304). The second conductive-type is the inverse of the first conductive-type.

In succession, whether an oxide film has been formed on the extracted substrate or not is judged (step S305).

In the case where the oxide film has been formed, all of the impurities A and B in the substrate are activated in a nitrogen atmosphere by annealing or the like (step S306). Then, the pulse CV characteristics are measured using a pulse CV-measuring device provided with a built-in electrode, such as a mercury prover (step S308).

On the other hand, when the oxide film has not been formed, an oxide film is formed and all of the impurities A and B are activated in the same manner as in the case where the oxide film has been formed (step S307). Then, the pulse CV characteristics are measured (step S308).

Next, an extension of a depletion layer is calculated from the pulse CV characteristics of the extracted substrate to calculate the distribution of carrier concentration in the direction of the depth (step S309).

In succession, an SIMS measurement is made at the same position as in the case of making the pulse CV measurement (step S310). The steps S308 to S310 correspond to the step S401 shown in FIG. 1.

Next, the distribution of carrier concentration is estimated based on the resulting SIMS profile (step S311).

The impurity concentration of the profile based on the SIMS measurement is then calibrated by a method of least squares so that, in a range of depth where accuracy of the carrier concentration is secured, a dose amount got from the profile of impurity concentration estimated in the step S311 coincide with a dose amount got from the profile of the carrier concentration obtained in the step S309 (step S312). The step S312 corresponds to the step S402 shown in FIG. 1.

These steps ensure that an impurity profile supported by the electric characteristics can be obtained as shown in the step S403 in FIG. 1.

In this embodiment, the impurity B of the inverse conductive-type to that of the impurity A is introduced in the step S304. Therefore, even if the concentration of the impurity A is high, the impurity concentration can be appropriately calibrated.

Incidentally, in these embodiments, the impurity concentration can be quantitated by using a recording medium in which the above steps are recorded and by allowing a computer to execute the program stored in the recording medium for quantitating impurity concentration.

What is claimed is:
1. A method for quantitating impurity concentration comprising:
   introducing one kind of impurity into a plurality of semiconductor substrates;
   introducing another kind of impurity into said semiconductor substrates except for one semiconductor substrate;
   repeating said introducing said another kind of impurity into said semiconductor substrates except for n semiconductor substrates, n being a number of preceding impurity introducing steps, until introducing a last kind of impurity into a remaining one semiconductor substrate;
   measuring pulse CV characteristics of one semiconductor substrate selected from said semiconductor substrates every time an impurity is introduced;
   calculating distribution of carrier concentration in a direction of a depth of said semiconductor substrate from said pulse CV characteristics;
   making SIMS measurement of said semiconductor substrate at a same position as in said measuring said pulse CV characteristics to calculate SIMS profile of said impurity;
   calibrating said SIMS profile by a method of least squares so that a dose amount from said SIMS profile coincides with a dose amount from said distribution of carrier concentration in a range of depth where accuracy of said carrier concentration is secured, when said introduction of an impurity is the first introduction;
   making simulation of each step up to a next introduction of an impurity to estimate distribution of carrier concentration prior to said next introduction of an impurity;
   comparing said distribution of carrier concentration estimated after a last introduction of an impurity is completed with an actual value of said distribution of carrier concentration after an instant introduction of an impurity is completed, when said introduction of an impurity is not the first introduction;
   calculating a dose amount of said impurity introduced based on a result of said comparing;
   calibrating said SIMS profile by a method of least squares so that its dose amount coincides with a calculated dose amount; and making simulation of each step up to a next introduction of an impurity to estimate distribution of carrier concentration prior to said next introduction of an impurity.

2. A method for quantitating impurity concentration according to claim 1, further comprising:

forming an oxide film on said semiconductor substrate after introducing each said impurity.

3. A method for quantitating impurity concentration according to claim 2, wherein said oxide film is formed after determining that substantially no oxide film is present.

4. A method for quantitating impurity concentration according to claim 1, further comprising:

activating said impurity after introducing each said impurity.

5. A method for quantitating impurity concentration according to claim 4, wherein said impurity is activated after determining that said impurity is inert.

6. A method for quantitating impurity concentration according to claim 4, wherein said impurity is activated by nitrogen annealing.

7. A method for quantitating impurity concentration according to claim 1, wherein said impurity concentrations are accurately quantitated at wide-ranging depths.

8. A method for quantitating impurity concentration according to claim 1, wherein said impurities comprise inert impurities.

* * * * *